(12) United States Patent
Finkelstein

(10) Patent No.: US 6,902,116 B2
(45) Date of Patent: *Jun. 7, 2005

(54) METHOD FOR MAKING A FINANCIAL TRANSACTION CARD WITH EMBEDDED ELECTRONIC CIRCUITRY

(75) Inventor: Alan Finkelstein, Beverly Hills, CA (US)

(73) Assignee: Innovative Card Technologies, Inc., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/300,168

(22) Filed: Nov. 20, 2002

(65) Prior Publication Data

US 2003/0226899 A1 Dec. 11, 2003

Related U.S. Application Data

(63) Continuation-in-part of application No. 10/167,259, filed on Jun. 11, 2002.

(51) Int. Cl.[7] ............................................. G06K 19/06
(52) U.S. Cl. ..................... 235/492; 235/379; 235/380; 235/493; 235/487; 902/25; 902/26; 902/29
(58) Field of Search ................................. 235/492, 493, 235/379, 380, 487, 488; 902/25–26, 2, 29; 257/678, 679; 29/592; 156/300

(56) References Cited

U.S. PATENT DOCUMENTS

| | | |
|---|---|---|
| 373,597 A | 11/1887 | McMicken |
| 2,234,942 A | 3/1941 | Nichols |
| 2,631,368 A | 3/1953 | Baukus |
| 2,826,959 A | 3/1958 | Schneider |
| 3,108,853 A | 10/1963 | Short et al. |
| 3,117,608 A | 1/1964 | Goss et al. |
| 3,140,883 A | 7/1964 | Anthony |
| 3,209,648 A | 10/1965 | Chapman |
| 3,409,347 A | 11/1968 | Vogel |
| 3,437,548 A | 4/1969 | Ayers |

(Continued)

FOREIGN PATENT DOCUMENTS

| | | | |
|---|---|---|---|
| DE | 69200552.7 | 4/1992 | |
| EP | H0805 D/31 | 12/1980 | |
| EP | 0032368 | 7/1981 | |
| EP | 323-108 A | 12/1987 | |
| EP | 0 496 544 | 1/1992 | |
| FR | 2 726 384 | 10/1994 | |
| GB | 2 222 280 | 8/1998 | |
| JP | 55-061587 | 5/1980 | |
| JP | 55-83015 | 6/1980 | |
| JP | 56-212679 | 12/1981 | |
| JP | 59-124818 | 7/1984 | |
| JP | 59-124819 | 7/1984 | |
| JP | 361167506 | 7/1986 | |
| JP | 1-171991 | 6/1989 | |
| JP | 402006123 | 1/1990 | |
| JP | 2-56680 | 4/1990 | |
| JP | 2-92513 | 4/1990 | |
| JP | 4-0191815 | 4/1992 | |
| JP | 08085282 A | * 4/1996 | ........... B42D/15/10 |
| JP | 2000085283 A | * 3/2000 | ........... B42D/15/10 |
| JP | 2000272279 A | * 10/2000 | ........... B42D/15/10 |

*Primary Examiner*—Karl D. Frech
*Assistant Examiner*—Daniel Walsh
(74) *Attorney, Agent, or Firm*—Blakely Sokoloff Taylor & Zafman, LLP

(57) ABSTRACT

Financial transaction and similar cards are fabricated with a split core adapted to received embedded electronic circuitry. The card core has two or more laminated layers. The cavity is milled into one or more of the layers to receive the electronic circuitry. The core layers are then laminated together, along with protective overlays. Alternative fabrication methods include co-extrusion and injection molding.

10 Claims, 5 Drawing Sheets

U.S. PATENT DOCUMENTS

| | | |
|---|---|---|
| 3,571,957 A | 3/1971 | Cumming |
| 3,712,707 A | 1/1973 | Henkes, Jr. |
| 3,963,309 A | 6/1976 | Schwab |
| 4,011,857 A | 3/1977 | Rice |
| 4,044,889 A | 8/1977 | Orentreich et al. |
| 4,067,947 A | 1/1978 | Miori |
| 4,076,384 A | 2/1978 | Deml et al. |
| 4,137,863 A | 2/1979 | Anglin |
| 4,294,782 A | 10/1981 | Froehlig |
| 4,393,610 A | 7/1983 | Adrian |
| 4,435,912 A | 3/1984 | Adrian et al. |
| 4,486,363 A | 12/1984 | Pricone et al. |
| 4,502,236 A | 3/1985 | Adrian |
| 4,509,823 A | 4/1985 | Moriguchi et al. |
| 4,571,497 A | 2/1986 | Henry et al. |
| 4,601,861 A | 7/1986 | Pricone et al. |
| 4,677,285 A | 6/1987 | Taniguchi |
| 4,805,680 A | 2/1989 | Ueno |
| 4,863,026 A | 9/1989 | Perkowski |
| 4,881,334 A | 11/1989 | Brown |
| 5,124,089 A | 6/1992 | Ohkoshi et al. |
| 5,141,677 A | 8/1992 | Fogarty |
| 5,151,582 A | 9/1992 | Fujioka |
| 5,183,597 A | 2/1993 | Lu |
| 5,198,168 A | 3/1993 | Thurston |
| 5,215,334 A | 6/1993 | Presson et al. |
| 5,359,597 A | 10/1994 | McLamb et al. |
| 5,359,684 A | 10/1994 | Hosokawa et al. |
| 5,534,101 A | 7/1996 | Keyworth et al. |
| 5,642,228 A | 6/1997 | Takezawa et al. |
| 5,677,568 A | 10/1997 | Ochi et al. |
| 5,681,871 A | 10/1997 | Molock et al. |
| 5,695,346 A | 12/1997 | Sekiguchi et al. |
| 5,735,040 A | 4/1998 | Ochi et al. |
| 5,856,661 A | 1/1999 | Finkelstein et al. |
| 5,927,846 A | 7/1999 | Sinclair |
| 5,976,391 A * | 11/1999 | Belke et al. ............... 216/13 |
| 6,070,990 A | 6/2000 | Dalton et al. |
| 6,073,854 A | 6/2000 | Bravence et al. |
| 6,248,199 B1 * | 6/2001 | Smulson ............... 156/244.12 |
| 6,250,554 B1 * | 6/2001 | Leo et al. ............... 235/487 |
| 6,259,606 B1 | 7/2001 | Bunert |
| 6,271,801 B2 | 8/2001 | Tuttle et al. |
| 6,296,188 B1 | 10/2001 | Kiekhaefer |
| 6,305,609 B1 * | 10/2001 | Melzer et al. ............... 235/487 |
| 6,325,284 B1 | 12/2001 | Walker et al. |
| 6,330,162 B1 | 12/2001 | Sakamoto et al. |
| 6,428,199 B1 * | 8/2002 | Rupaner et al. ............... 366/172.1 |
| 6,471,128 B1 * | 10/2002 | Corcoran et al. ............... 235/488 |
| 6,644,552 B1 * | 11/2003 | Herslow ............... 235/488 |
| 6,659,355 B1 * | 12/2003 | Fischer et al. ............... 235/492 |
| 2002/0066790 A1 * | 6/2002 | Cocco ............... 235/491 |
| 2002/0145049 A1 * | 10/2002 | Lasch et al. ............... 235/488 |
| 2003/0038174 A1 * | 2/2003 | Jones ............... 235/380 |
| 2003/0141373 A1 * | 7/2003 | Lasch et al. ............... 235/487 |
| 2003/0178495 A1 * | 9/2003 | Jones et al. ............... 235/492 |

* cited by examiner

METHOD FOR MAKING A FINANCIAL TRANSACTION CARD WITH EMBEDDED ELECTRONIC CIRCUITRY

RELATED APPLICATIONS

This is a continuation-in-part of co-pending U.S. patent application Ser. No. 10/167,259 filed Jun. 11, 2002, the disclosure of which is hereby incorporated by reference.

This application is also related to U.S. patent application Ser. No. 09/767,317 filed Jan. 22, 2001, which is a continuation-in-part of U.S. patent application Ser. No. 09/066,799 filed Apr. 24, 1998, now U.S. Pat. No. 6,176,430, which is a continuation-in-part of U.S. patent application Ser. No. 08/758,640 filed Nov. 27, 1996, now U.S. Pat. No. 5,856,661, which is a continuation-in-part of U.S. patent application Ser. No. 08/582,601 filed Jan. 3, 1996, now U.S. Pat. No. 5,608,203, which is a continuation of U.S. patent application Ser. No. 08/250,801 filed May 27, 1994, abandoned, which is a continuation-in-part of U.S. patent application Ser. No. 08/197,218, filed Feb. 16, 1994, now U.S. Pat. No. 5,434,405 which is a continuation-in-part of U.S. patent application Ser. No. 07/834,490, filed Feb. 12, 1992, now U.S. Pat. No. 5,412,199. The disclosures of these earlier applications are also incorporated by reference.

BACKGROUND OF THE INVENTION

1. Field of the Invention

The present invention relates to financial transaction cards and is specifically directed to a financial transaction card, such as a credit card, having embedded electronic circuitry, such as a built-in light or sound generator.

2. Background

The previously issued co-owned patents, namely, U.S. Pat. Nos. 5,412,199; 5,434,405; 5,608,203; 5,856,661; and 6,176,430 disclose financial transaction cards with integral magnifying lenses and methods for making such cards. Such cards are convenient for magnifying and reading printed information, such as sales receipts and the like. Frequently, the user of such a card will desire to read information in a low light situation. To facilitate this, it is desirable to have a source of illumination in proximity to the magnifying lens. Even without a magnifying lens, there are many situations in which it would be desirable to have a financial transaction card that incorporates a source of illumination.

Heretofore, sources of illumination, e.g. flashlights, have been proposed with the same general shape as a credit card or a similar wallet card. Such a light is shown, for example, in U.S. Pat. No. 5,927,846. However, these prior art lights are significantly thicker than an ordinary credit card and, therefore, do not meet the standards for such cards prescribed by the International Organization of Standardization (ISO). Accordingly, prior art card shaped lights are incapable of functioning as financial transaction cards.

SUMMARY OF THE INVENTION

The present invention provides a financial transaction card that has a thin, flat, substantially rigid substrate and electronic circuitry disposed within the substrate. In an exemplary embodiment, the electronic circuitry may include a source of illumination. A source of electrical current is coupled to the source of illumination and a switch is provided to selectively close an electrical circuit between the source of electrical current and the source of illumination. As is customary for financial transaction cards, embossed alphanumeric indicia are included on the substrate.

Such a card may be made by printing first card graphics on a first surface of a first core member and laminating a first overlay to the first surface of the first core member. A cavity is routed in a second surface of the first core member and electric components are installed in the cavity. The cavity is then filled. Second card graphics are printed on a first surface of a second core member and a second overlay is laminated thereto. The two core members are then joined by securing the second surface of the first core member to a second surface of the second core member.

Various similar methods of card construction are also disclosed.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

Figure 1:
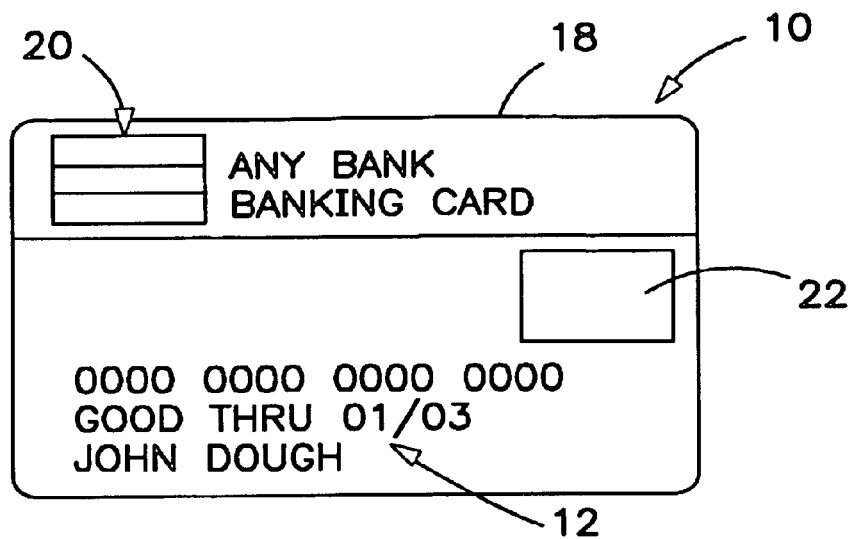
FIG. 1 shows the top side of a financial transaction card incorporating a magnifying lens.

A typical credit card 10 is shown in FIG. 1. The size and general layout of card 10 have become standardized and similar cards are widely used for a variety of transactions and other purposes. As used herein, the term "financial transaction card" includes not only a conventional credit card, but also any type of card carried by a consumer that includes a magnetic strip or other data storage medium and that is physically and/or functionally similar to a conventional credit card. Such cards include, for example, debit cards, electronic cash cards, gift cards and similar assigned value cards, pre-paid calling cards, internet access cards, health insurance cards, identification cards, association membership cards, etc.

Figure 2:
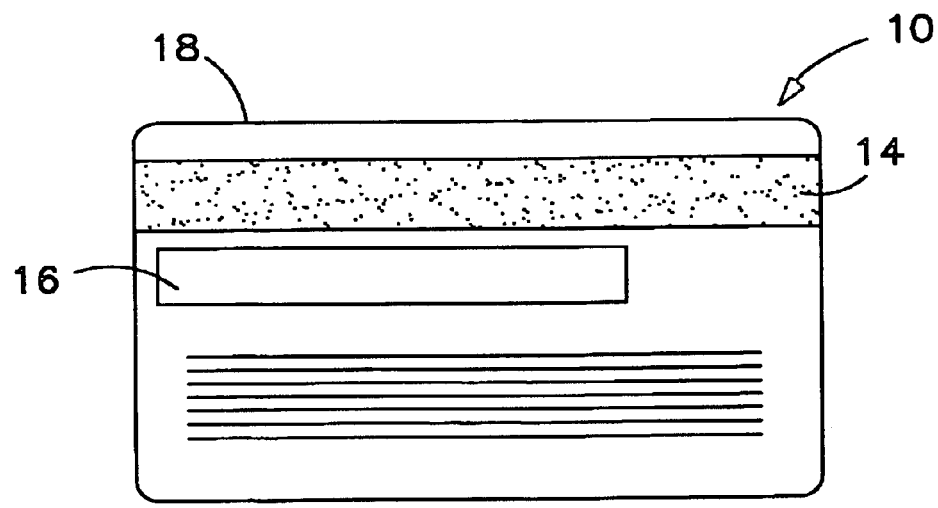
FIG. 2 shows the bottom side of the financial transaction card of FIG. 1.

Card 10 includes, as is common, embossed lettering at 12, which permits the credit card to be imprinted at a point-ofsale transaction. As is shown in FIG. 2, most credit cards now contain a strip 14 for carrying machine readable information, for example a magnetic strip material which includes magnetically encoded information readable by computer terminals utilized in many point-of-sale terminals. Also included is a signature strip 16 which is on the back of the card and which typically is adapted for receiving a signature to be manually applied by the user of the card. The card may further include one- or multi-dimensional bar codes as well as smart card contact, contactless or combi-card electronic information storage.

The magnetic strip 14 and embossed lettering 12, along with the signature strip 16, identify a data zone on the card. For financial transaction cards, this data zone is generally controlled by ISO standards in an effort to standardize the cards so that various cards issued by a multiplicity of institutions may be used on standardized terminals the point-of-sale. For example, the placement of the magnetic strip 14 relative to the top edge 18 of the card is standardized, as is the width of the strip 14 in order to permit ready readability of the magnetically coded information by any typical point-of-sale magnetic reader. Likewise, the font, size and position of the embossed lettering 12 is controlled to assure machine readability of the information imprinted from the card when a point-of-sale transaction is made on a typical credit card imprinter. Only the position of the signature strip 16 can be altered without interfering with the machine readability of the card.

Today, many cards also include identifying indicia such as logotypes and the like as indicated at 20 for identifying the issuing institution. An increasing number of cards also include a hologram panel 22 which includes issuing institution indicia. The hologram panel 22 is generally located in or near the portion of the data zone including the embossed lettering 12.

Figure 3:
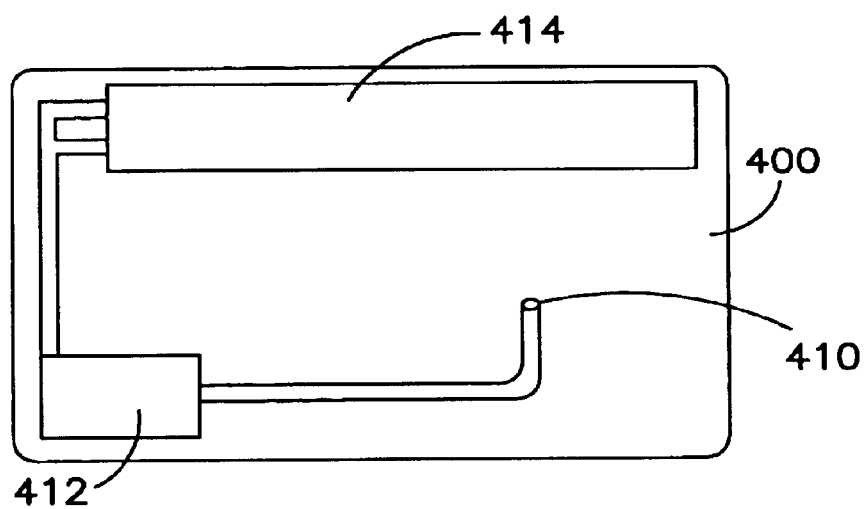
FIG. 3 is a plan view of a financial transaction card incorporating a light in accordance with the subject invention.

FIG. 3 is a cross-sectional view of a financial transaction card 400 having a light 410 and associated electronic components embedded therein. Optionally, card 400 may incorporate a magnifying lens (not shown) formed by the methods described in this inventor's earlier patents. Light 410 is preferably a light-emitting diode (LED), although any other suitable source of illumination may be utilized, such as a conventional incandescent bulb, electroluminescent panel, light-emitting polymer or the like. Although only a single light 410 is illustrated, a plurality of lights may be installed, if desired.

Light 410 is powered by one or more batteries 414 disposed within card 400. Conventional wafer cell batteries may be used; however, a flat laminated battery is preferred. Ultra-thin battery construction is described, for example, in U.S. Pat. No. 5,888,672.

To control operation of light 410, a switch, such as switch 412, is placed at a convenient location on card 400. Switch 412 is preferably a pressure sensitive switch that may be activated by finger pressure when card 400 is held between the thumb and index finger.

A method of manufacturing card 400 is illustrated in FIGS. 4A–4E. This method utilizes a split core construction to which front and rear overlays are laminated. A first core member 420 has a thickness of approximately 24.4 mils. The surface of core member 420 is printed with graphics appropriate for the particular card application. The printed surface of core member 420 is then laminated with overlay 422, which has a thickness of approximately 1.6 mils. A hot lamination process may be employed with a pressure of about 200–400 psi and a temperature of about 200°–300° F.

Figure 4A:
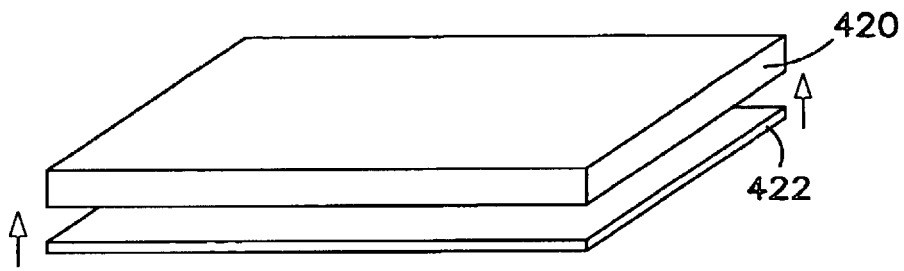
FIGS. 4A–4E illustrate a method of constructing a financial transaction card incorporating a light.
Figure 4B:
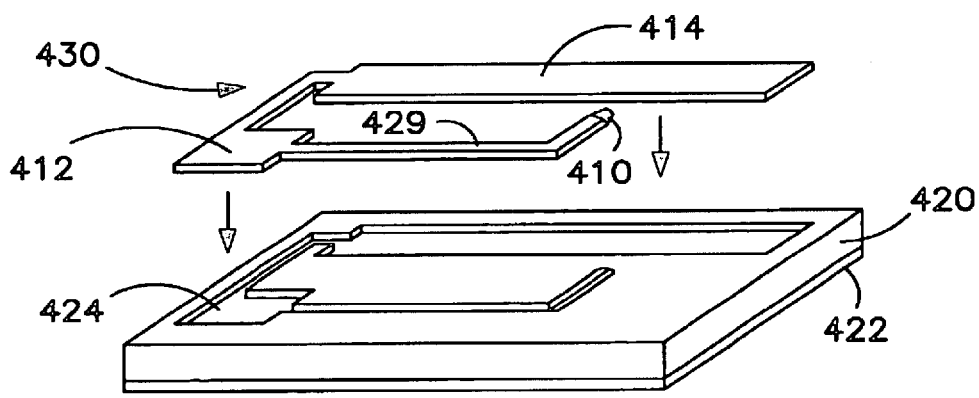

Referring next to FIG. 4B, a cavity 424 is milled or routed into core member 420 to accept the electronic components denoted generally by reference numeral 430. These components include battery 414, at least one light-emitting diode (LED) 410, switch 412 and interconnection circuitry 429. The interconnection circuitry may be formed within cavity 424 by a printing process with conductive ink or by deposition of metallic circuit traces. Alternatively, the entire floor of cavity 424 may be metallized and circuit traces nay then be formed using a conventional photoetching process. Once the interconnection circuitry has been formed, the battery 414, LED 410 and switch 412 are inserted in respective areas of the cavity and electrically bonded to the interconnection circuitry using conventional bonding techniques. In another alternative, the components may be first connected electrically and mounted as a unit on a suitable carrier prior to being inserted into cavity 424.

Figure 4C:
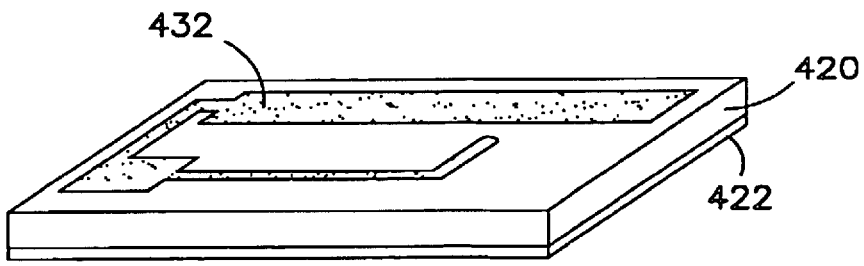

With reference now to FIG. 4C, the cavity 424 is filled with an ultraviolet (UV) curable resin or a similar potting compound. Once cured, the exposed compound 432 is milled or shaved flush with the surface of core member 420. This may be accomplished using a diamond impregnated fly cutter.

Figure 4D:
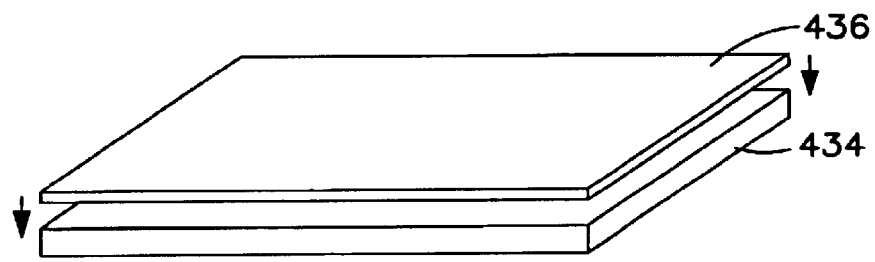

Turning next to FIG. 4D, a second core member 434 is printed with appropriate graphics and laminated with overlay 436. Core member 434 has a thickness of approximately 5 mils, which is about the minimum for use with existing printing and laminating processes.

Figure 4E:
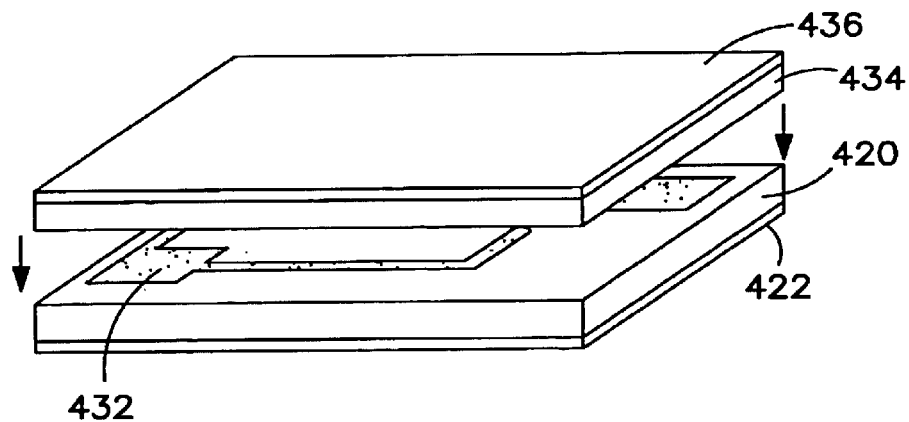

The core members 420 and 434 are joined together as shown in FIG. 4E. A hot lamination process may be used; however, the electronic components, particularly battery 426, may suffer adversely in such a process. In this case, core members 420 and 434 may be joined with a cold lamination process or may be glued together with a suitable adhesive. Acceptable adhesives are available that can join the core members at a temperature of only about 100° F., which is low enough to avoid damage to the electronic components. The finished card has a thickness within the ISO specifications of 0.027 to 0.033 inch.

Although FIGS. 4A–4E illustrate the manufacture of a single card, it will be understood that a plurality of cards may be processed simultaneously in sheets and that the sheets may then be cut into individual cards after the process is complete. Also, while cavity 424 is shown as being formed in core member 420, cooperating cavities may be formed in the two core members, in which case they may be equal, or nearly so, in thickness.

As mentioned above, the completed card may include an integral magnifying lens, if desired. If so, core members 420 and 434 are preferably formed of a clear plastic material as described in this inventor's earlier patents. The graphic design imprinted on the surfaces of the core members will, of course, leave a transparent window where the lens is to be located. The lens may be formed by hot stamping fresnel contours as described in the referenced patents. Further processing of the card, such as embossing, the addition of holograms, magnetic stripes, etc. is accomplished in the same manner as for the previously patented embodiments. As mentioned above, appropriate care is taken to locate electronic components 430 in areas of the card that will not be subject to embossing.

The use of a clear plastic material for core member 420 and/or core member 434 allows formation of a collimating lens for LED 410. An LED typically disperses light over a wide angle. A collimating lens concentrates the light within a narrower angle so that card 400 is a more effective source of illumination. A collimating lens may be formed in the same manner as a magnifying lens. It will be understood, however, that incorporation of a collimating lens for LED 410 does not require that a magnifying lens also be included in card 400.

Figure 5:
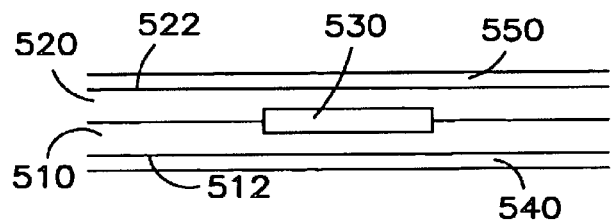
FIG. 5 is a partial cross-sectional view illustrating another method of constructing a financial transaction card with embedded electronic circuitry.

Another method of manufacturing card 400, somewhat similar to the method illustrated in FIGS. 4A–4E, is illustrated in FIG. 5. The core of the card comprises core members 510 and 520, each of which is made from clear plastic stock having a nominal thickness of 13.5 mils. Card graphics are printed on side 512 of core member 510 and on side 522 of core member 520. Each of core members 510 and 520 are milled to create cavity 530. The embedded electronic components are inserted between core members 510 and 520 within cavity 530. Clear plastic overlays 540 and 550, each with a nominal thickness of 1.6 mils, are placed over surfaces 512 and 522, respectively. Core members 510 and 520 and overlays 540 and 550 are then laminated together using a hot lamination process at a temperature of about 300° F. and a pressure of about 200 psi.

Figure 6:
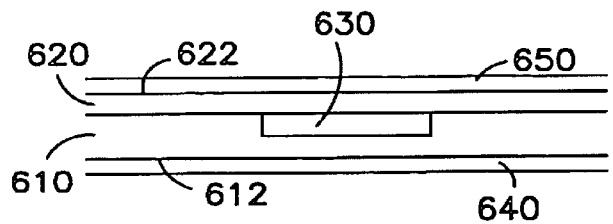
FIG. 6 is a partial cross-sectional view illustrating another method of constructing a financial transaction card with embedded electronic circuitry.

Another method of manufacturing card 400 is illustrated in FIG. 6. Core member 610 comprises three layers of clear plastic material having a nominal thickness of 13.5 mils that are laminated together. Core member 620 comprises a single layer of the same material. Card graphics are printed on surface 612 of core member 610 and on surface 622 of core member 620. Overlays 640 and 650, each having a nominal thickness of 1.6 mils, are hot laminated to core members 610 and 620, respectively. Cavity 630 is then milled into core member 610. Electronic components are inserted into cavity 630 and the remaining volume of the cavity is filled with a suitable potting compound. After the potting compound is cured, the combination of core member 610 and overlay 640 is reduced in thickness to approximately 23 mils using a fly cutting process. The combination of core member 620 and overlay 650 is also reduced in thickness to approximately 8 mils. Core members 610 and 620 are then joined together using a cold lamination process at a temperature of about 100° F.

The method illustrated in FIG. 6 can also be practiced using a hot lamination process. In this case, the steps of milling core member 610, potting the electronic components and fly-cutting core members 610 and 620 are performed prior to laminating overlays 640 and 650 to their respective core members. As in the method illustrated in FIG. 5, core members 610 and 620 and overlays 640 and 650 are all joined together during the hot lamination process.

Figure 7:
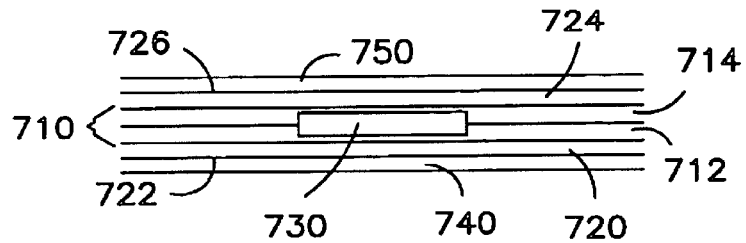
FIG. 7 is a partial cross-sectional view illustrating another method of constructing a financial transaction wallet card with embedded electronic circuitry.

Another method of manufacturing card 400 is illustrated in FIG. 7. In this method, core member 710, with an overall thickness of approximately 20 mils, is constructed by first milling a cavity 730 into opposing surfaces of core members 712 and 714. Each of core members 712 and 714 comprise a clear plastic material having a thickness of approximately 13.5 mils. These two core members are hot laminated together after inserting the electronic components into cavity 730. At the same time, additional layers of 13.5 mil material are hot laminated to core members 712 and 714, respectively. The resulting four-layer material is then reduced in thickness to approximately 20 mils using a fly cutting process. Core members 720 and 724, each having a nominal thickness of 5 mils, are prepared by printing card graphics on surfaces 722 and 726, respectively. Finally core members 710, 720 and 724 and overlays 740 and 750, each having a nominal thickness of 1.6 mils, are laminated together using a hot lamination process.

Figure 8:
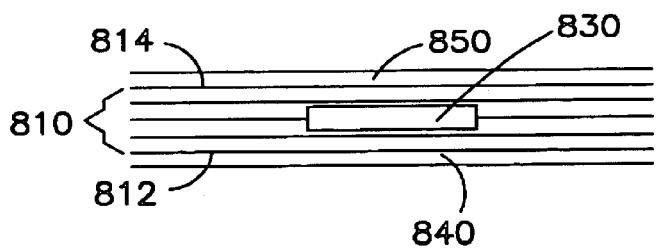
FIG. 8 is a partial cross-sectional view illustrating another method of constructing a financial transaction card with embedded electronic circuitry.

Another method of manufacturing card 400 is illustrated in FIG. 8. In this method, core member 810 having cavity 830 is constructed in the same manner as core member 710 of the previously described embodiment, except that it is fly-cut to a thickness of approximately 28 mils. Ink of an appropriate background color is then silk-screened onto surfaces 812 and 814 of core member 810. Card graphics are then printed onto the inked surfaces, preferably using a thermal transfer ribbon or dye sublimation process using, for example, a Fargo printer. Overlays 740 and 750, each having a nominal thickness of 1.6 mils, are then hot laminated to core member 710. One disadvantage of this method is that, since core member 710 is printed with card graphics after the electronic components have been embedded, any printing errors will result in a loss of the electronic components.

Figure 9:
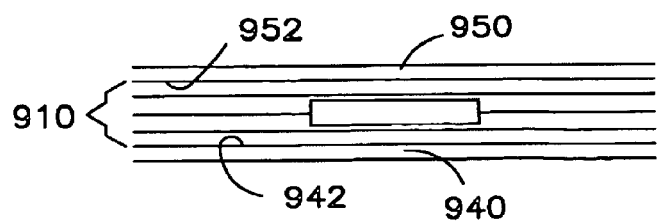
FIG. 9 is a partial cross-sectional view illustrating another method of constructing a financial transaction card with embedded electronic circuitry.

Another method of manufacturing card 400 is illustrated in FIG. 9. Core member 910 is constructed in the same fashion as core members 710 and 810 of the previously described embodiments, except that it is fly-cut to a thickness of approximately 23 mils. Overlays 940 and 950, each having a nominal thickness of 5.4 mils, are reversed printed with card graphics on surfaces 942 and 952, respectively. Overlays 940 and 950 may each comprise laminations of, for example, three layers of uncoated overlay material having a nominal thickness of 1.8 mils. After the overlays have been printed, they are hot laminated to core member 910.

An alternative method of manufacturing card 400 is basically similar to the previously described methods; however, the split core members are fabricated using an extrusion process. A first core member is extruded with a cavity in place. This core member is printed and laminated as in the previously described process. Furthermore, the electronic components are installed and potted in the same manner as previously described. A second core member is also extruded and is then laminated to the completed first core member.

Another alternative method of manufacturing card 400 utilizes an injection molding process. In this method, the electronic components are assembled as a unit as previously described. The unit is then suspended within a mold with dimensions of the finished card (not including overlays) and a suitable plastic material is injected. After release from the mold, the surfaces of the card are printed with appropriate card graphics and covered with clear plastic overlays. The overlays are hot laminated to the card core as in the previously described embodiments.

The methods of the present invention have been described in the context of a financial transaction card with embedded electronic circuitry for a light. It will be recognized, however, that these methods are also applicable to other types of cards having a thickness comparable to that of financial transaction cards. Moreover, these methods are applicable to cards with other types of electronic circuitry, including, for example, smart cards, cards with electronic displays, cards incorporating wireless communications, cards with sound generators, etc.

It will be recognized that the above-described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A method of constructing a card with embedded electronic circuitry comprising:

printing first card graphics on a first surface of a first core member;

printing second card graphics on a first surface of a second core member;

laminating a first overlay to the first surface of the first core member;

laminating a second overlay to the first surface of the second core member;

milling a cavity in a second surface of the first core member after the first overlay has been laminated to the first surface of the first core member;

installing electronic components in the cavity;

aligning the second surface of the first core member with a second surface of the second core member;

laminating together the first and second core members.

2. The method of claim 1 wherein the first and second core members are laminated together using a cold lamination process.

3. The method of claim 1 wherein the first core member comprises a plurality of layers of material laminated together.

4. The method of claim 3 further comprising reducing the thickness of the laminated first core member and first overlay after the electronic components are installed in the cavity.

5. The method of claim 1 wherein installing electronic components in the cavity includes filling the cavity with a curable resin.

6. The method of claim 1 wherein each of the first and second core members and first and second overlays are made of a transparent material.

7. The method of claim 6 further comprising forming a magnifying lens in a portion of the card.

8. The method of claim 1 wherein the electronic components comprise a battery.

9. The method of claim 1 wherein the electronic components comprise a switch.

10. The method of claim 1 wherein the electronic components comprise an LED.

* * * * *

UNITED STATES PATENT AND TRADEMARK OFFICE
CERTIFICATE OF CORRECTION

| | |
|---|---|
| PATENT NO. | : 6,902,116 B2 |
| APPLICATION NO. | : 10/300168 |
| DATED | : June 7, 2005 |
| INVENTOR(S) | : Alan Finkelstein |

Page 1 of 1

It is certified that error appears in the above-identified patent and that said Letters Patent is hereby corrected as shown below:

Title Page, in Item [56], Under U.S. Patent Documents, line 2, please delete "3/1941" and insert -- 7/1939 --.

Title Page, in Item [56], Under U.S. Patent Documents, line 3, please delete "3/1953" and insert -- 10/1948 --.

Title Page, in Item [56], Under U.S. Patent Documents, line 4, please delete "3/1958" and insert -- 2/1956 --.

Signed and Sealed this

First Day of July, 2008

JON W. DUDAS
*Director of the United States Patent and Trademark Office*